(12) United States Patent
Huai et al.

(10) Patent No.: US 7,245,462 B2
(45) Date of Patent: Jul. 17, 2007

(54) MAGNETORESISTIVE ELEMENT HAVING REDUCED SPIN TRANSFER INDUCED NOISE

(75) Inventors: Yiming Huai, Pleasanton, CA (US); Paul P. Nguyen, San Jose, CA (US)

(73) Assignee: Grandis, Inc., Milpitas, CA (US)

( * ) Notice: Subject to any disclaimer, the term of this patent is extended or adjusted under 35 U.S.C. 154(b) by 414 days.

(21) Appl. No.: 10/839,064

(22) Filed: May 5, 2004

(65) Prior Publication Data

US 2005/0041342 A1 Feb. 24, 2005

Related U.S. Application Data

(60) Provisional application No. 60/497,252, filed on Aug. 21, 2003.

(51) Int. Cl.
*G11B 5/33* (2006.01)

(52) U.S. Cl. .................................. 360/324.11

(58) Field of Classification Search ........... 360/324.12, 360/324.11, 314, 324.2, 126; 205/255
See application file for complete search history.

(56) References Cited

U.S. PATENT DOCUMENTS

| | | | |
|---|---|---|---|
| 6,353,511 B1* | 3/2002 | Shi et al. ..................... | 360/126 |
| 2003/0007398 A1 | 1/2003 | Daguhton et al. | |
| 2003/0128483 A1* | 7/2003 | Kamijo ................... | 360/324.11 |
| 2003/0227722 A1* | 12/2003 | Freitag et al. ......... | 360/324.11 |
| 2004/0008450 A1* | 1/2004 | Gill ............................ | 360/314 |
| 2004/0085689 A1* | 5/2004 | Freitag et al. ......... | 360/324.12 |
| 2005/0211563 A1* | 9/2005 | Ivey et al. ................. | 205/255 |

FOREIGN PATENT DOCUMENTS

EP 471946 A2 * 2/1992

OTHER PUBLICATIONS

J.C. Slonczewski, *Current-driven excitation of magnetic multilayers*, Journal of Magnetism and Magnetic Materials, 159 (1996) L1-L7.
L. Berger, *Emission of spin waves by a magnetic multilayer traversed by a current*, Physical Review B, vol. 54, No. 13, Oct. 1996, pp. 9353-9358.
F.J. Albert, et al., *Spin-polarized current switching of a Co thin film nanomagnet*, Applied Physics Letters, vol. 77, No. 23, Dec. 2000, pp. 3809-3811.
J. Grollier, et al., *Spin-polarized current induced switching in Co/Cu/Co pillars*, Applied Physics Letters, vol. 78, No. 23, Jun. 2001, pp. 3663-3665.

* cited by examiner

*Primary Examiner*—Tianjie Chen
(74) *Attorney, Agent, or Firm*—Strategic Patent Group, P.C.

(57) ABSTRACT

A method and system for providing a magnetic element is disclosed. The method and system include providing a ferromagnetic pinned layer, providing a free layer, and providing a spacer layer between the pinned layer and the free layer. The pinned layer and free layer are ferromagnetic and have a pinned layer magnetization and a free layer magnetization, respectively. The spacer layer is nonmagnetic. In one aspect, the free layer is configured to have an increased magnetic damping constant. In another aspect, the method and system also include providing a second pinned layer and a second spacer layer between the free layer and the second pinned layer. In this aspect, the first pinned layer and/or the second pinned layer are configured such that a forward torque and a reflected torque due to a current driven through the magnetic element in a current-perpendicular-to-plane configuration are substantially equal and opposite.

13 Claims, 8 Drawing Sheets

MAGNETORESISTIVE ELEMENT HAVING REDUCED SPIN TRANSFER INDUCED NOISE

CROSS-REFERENCE TO RELATED APPLICATION

This application is claiming under 35 USC 119(e) the benefit of provisional patent application Ser. No. 60/497,252 filed on Aug. 21, 2003.

FIELD OF THE INVENTION

The present invention relates to magnetoresistive heads, and more particularly to a method and system for providing improved magnetoresistive heads particularly suited for a current perpendicular to the plane configuration.

BACKGROUND OF THE INVENTION

FIGS. 1A and 1B depict conventional magnetic elements 10 and 10' that can be used to read magnetic recording data. The conventional magnetic element 10 is a spin valve and includes a conventional antiferromagnetic (AFM) layer 12, a conventional pinned layer 14, a conventional conductive spacer layer 16 and a conventional free layer 18. Other layers (not shown), such as seed or capping layer may also be used. The conventional pinned layer 14 and the conventional free layer 18 are ferromagnetic. Thus, the conventional free layer 18 is depicted as having a changeable magnetization 19. The conventional conductive spacer layer 16 is nonmagnetic. The AFM layer 12 is used to fix, or pin, the magnetization of the pinned layer 14 in a particular direction. The magnetization 19 of the free layer 18 is free to rotate, typically in response to an external magnetic field. The conventional magnetic element 10' depicted in FIG. 1B is a spin tunneling junction. Portions of the conventional spin tunneling junction 10' are analogous to the conventional spin valve 10. Thus, the conventional magnetic element 10' includes an AFM layer 12', a conventional pinned layer 14', a conventional insulating barrier layer 16' and a conventional free layer 18' having a changeable magnetization 19'. The conventional barrier layer 16' is thin enough for electrons to tunnel through in a conventional spin tunneling junction 10'.

Depending upon the orientations of the magnetization 19/19' of the conventional free layer 18/18' and the conventional pinned layer 14/14', respectively, the resistance of the conventional magnetic element 10/10', respectively, changes. When the magnetization 19/19' of the conventional free layer 18/18' is parallel to the magnetization of the conventional pinned layer 14/14', the resistance of the conventional magnetic element 10/10' is low. When the magnetization 19/19' of the conventional free layer 18/18' is antiparallel to the magnetization of the conventional pinned layer 14/14', the resistance of the conventional magnetic element 10/10' is high.

In order to read data, the conventional magnetic element 10/10' is brought into proximity with a magnetic media near the air-bearing surface (ABS). The conventional free layer 18/18' responds to the varying magnetic field from the recording media. As a result, the magnetization 19/19' of the conventional free layer 18/18' will be substantially parallel or antiparallel to the magnetization of the pinned layer 14/14'. To read the data stored in the recording media, therefore, the resistance of the conventional magnetic element 10/10' is determined. The resistance of the conventional magnetic element 10/10' is sensed by driving a current through the conventional magnetic element 10/10'. Current may be driven in a CIP (current-in-plane) configuration or in a CPP (current perpendicular to the plane) configuration. In the CPP configuration, current is driven perpendicular to the layers of conventional magnetic element 10/10' (up or down, as seen in FIG. 1A or 1B).

In higher density recording applications beyond one hundred gigabits per square inch, the CPP configuration is an attractive candidate for use in a read head. However, when the sizes of the conventional magnetic elements 10/10' are shrunk down to deep submicron sizes (approximately <0.2 μm), a newly discovered phenomenon called the spin transfer effect can become dominant. The spin transfer effect is described more fully in J. C. Slonczewski, "Current-driven Excitation of Magnetic Multilayers," Journal of Magnetism and Magnetic Materials, vol. 159, p. L1-L5(1996). When a spin polarized current traverses a magnetic multilayer stack such as the conventional magnetic element 10/10' in a CPP configuration, a portion of the spin angular momentum of electrons incident on a ferromagnetic layer may be transferred to the ferromagnetic layer. In particular, electrons incident on the conventional free layer 18/18' may transfer a portion of their spin angular momentum to the conventional free layer 18/18'. As a result, a spin-polarized current can affect the direction of the magnetization 19/19' of the conventional free layer 18/18'. If the current density is sufficiently high (approximately $10^7$-$10^8$ A/cm$^2$) and the conventional free layer 18/18' is sufficiently thin, for instance, less than approximately ten nanometers for Co, the magnetization 19/19' of the free layer may actually be switched due to spin transfer. According to Slonczewski's model, the switching current density Jc for the free layer of a simple trilayer spin transfer stack (for example, thick Co/Cu/thin Co) is proportional to:

$$\alpha t M_s [H_{\mathit{eff}} - 2\pi M_s]/g(\theta)$$

where:

α=the phenomenological Gilbert damping constant;
t=the thickness of the free layer;
$M_s$=saturation magnetization of the free layer;
$H_{\mathit{eff}}$=effective field for the free layer;
g(θ) reflects the spin-transfer efficiency Thus, depending upon the values of the constants and fields described above, the magnitude of the spin transfer effect varies. The spin transfer effect can result in an asymmetric bias of the conventional free layer 18/18' and in magnetic noise in a magnetic recording read head.

Accordingly, what is needed is a system and method for reducing noise due to the spin transfer effect. The present invention addresses such a need.

SUMMARY OF THE INVENTION

The present invention provides a method and system for providing a magnetic element. The method and system comprise providing a ferromagnetic pinned layer, providing a free layer, and providing a spacer layer between the pinned layer and the free layer. The pinned layer and free layer are ferromagnetic and have a pinned layer magnetization and a free layer magnetization, respectively. The spacer layer is nonmagnetic. In one aspect, the free layer is configured to have an increased magnetic damping constant. In another aspect, the method and system also comprise providing a second pinned layer and a second spacer layer between the free layer and the second pinned layer. In this aspect, the first pinned layer and/or the second pinned layer are configured such that a forward torque and a reflected torque due to a current driven through the magnetic element in a current-perpendicular-to-plane (CPP) configuration are substantially equal and opposite.

DETAILED DESCRIPTION OF THE INVENTION

Figure 1A:
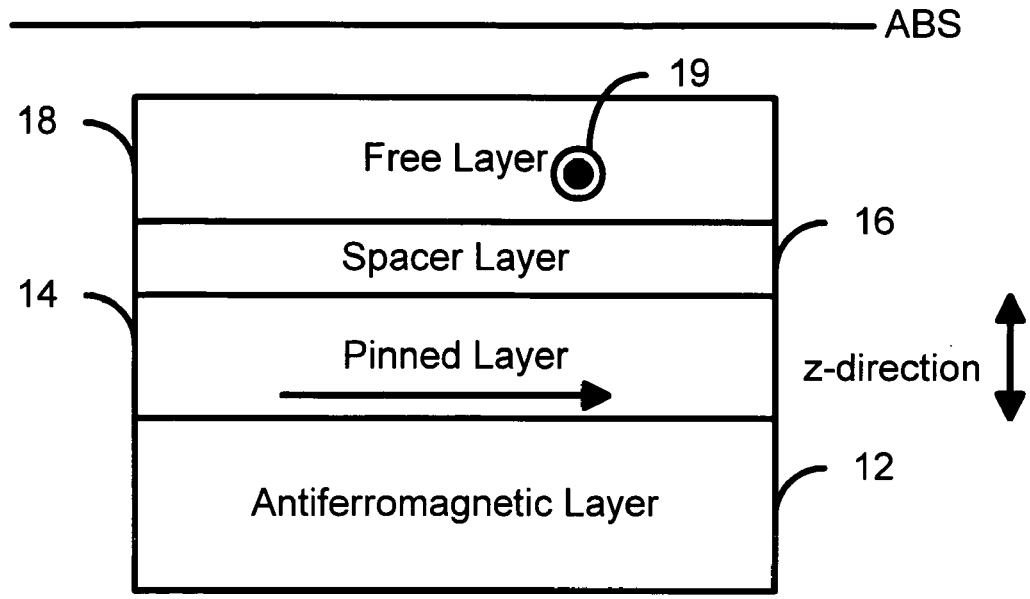
FIG. 1A is a diagram of a conventional magnetic element, a spin valve.

The present invention relates to an improvement in magnetic elements, particularly those employing magnetoresistance and current driven in a CPP configuration to read magnetic recording data. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a method and system for providing a magnetic element. The method and system comprise providing a ferromagnetic pinned layer, providing a free layer, and providing a spacer layer between the pinned layer and the free layer. The pinned layer and free layer are ferromagnetic and have a pinned layer magnetization and a free layer magnetization, respectively. The spacer layer is nonmagnetic. In one aspect, the free layer is configured to have an increased magnetic damping constant. In another aspect, the method and system also comprise providing a second pinned layer and a second spacer layer between the free layer and the second pinned layer. In this aspect, the first pinned layer and/or the second pinned layer are configured such that a forward torque and a reflected torque due to a current driven through the magnetic element in a CPP configuration are substantially equal and opposite.

The present invention will be described in terms of a particular magnetic element having certain components. However, one of ordinary skill in the art will readily recognize that this method and system will operate effectively for other magnetic memory elements having different and/or additional components having different and/or other features not inconsistent with the present invention. The present invention is also described in the context of current understanding of the spin transfer phenomenon. However, such a context is not intended to limit the scope of the present invention. One of ordinary skill in the art will also readily recognize that the method and system are described in the context of a structure having a particular relationship to the substrate. For example, as depicted in the drawings, the bottoms of the structures are typically closer to an underlying substrate than the tops of the structures. However, one of ordinary skill in the art will readily recognize that the method and system are consistent with other structures having different relationships to the substrate. In addition, the method and system are described in the context of certain layers being synthetic and/or simple. However, one of ordinary skill in the art will readily recognize that the layers could have another structure not inconsistent with the present invention. For example, although the method and system are described in the context of simple free layers, nothing prevents the present invention from being used with synthetic free layers. Furthermore, the present invention is described in the context of magnetic elements having particular layers. However, one of ordinary skill in the art will readily recognize that magnetic elements having additional and/or different layers not inconsistent with the present invention could also be used. Moreover, certain components are described as being ferromagnetic. However, as used herein, the term ferromagnetic could include ferrimagnetic or like structures. Thus, as used herein, the term "ferromagnetic" includes, but is not limited to ferromagnets and ferrimagnets. The present invention is also described in the context of single elements.

Figure 2A:
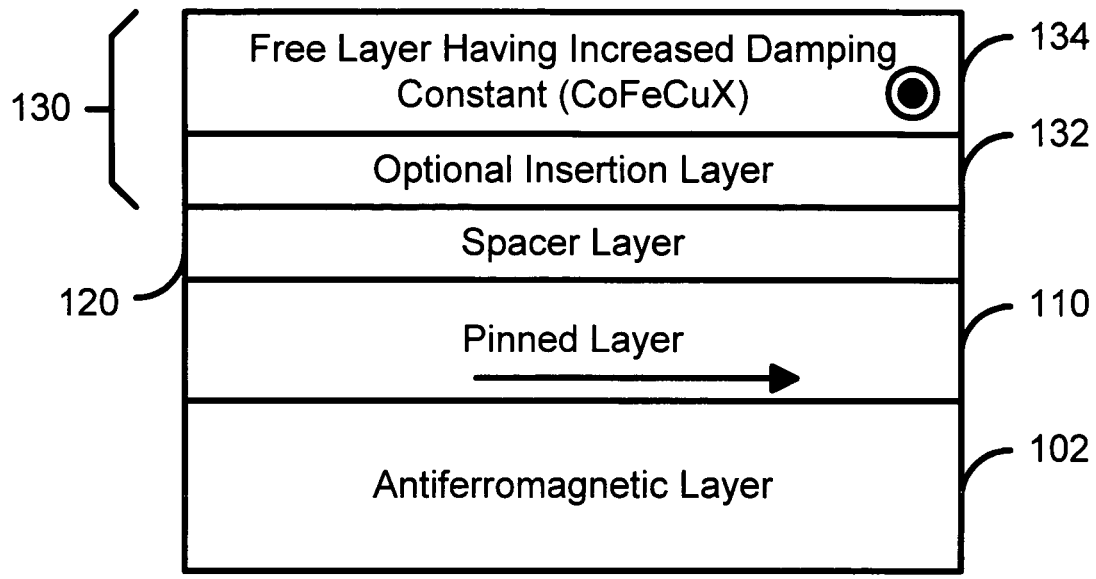
FIG. 2A depicts a first version of a first embodiment of a magnetic element in accordance with the present invention having increased noise due to spin transfer.

To more particularly illustrate the method and system in accordance with the present invention, refer now to FIG. 2A, depicting a first version of a first embodiment of a magnetic element 100 in accordance with the present invention having reduced noise due to spin transfer. The magnetic element 100 includes a pinned layer 110, a spacer layer 120, and a free layer 130. Also shown is a pinning layer 102, which is generally an AFM layer 102. In a preferred embodiment, the AFM layer 102 is PtMn with a thickness between fifty and five hundred Angstroms. In addition, seed layers (not shown) and capping layers (not shown) may also be provided. The pinned layer 110 is ferromagnetic and may be a simple pinned layer, as shown, or may be a synthetic pinned layer. If simple, the pinned layer 110 may be Co90Fe10 with a thickness of between five and one hundred Angstroms. The spacer layer 120 may be a conducting spacer layer, for example Cu, or an insulating tunneling barrier layer, such as alumina. If the spacer layer 120 is Cu, then the spacer layer 120 may have a thickness of between ten and one hundred Angstroms. If the spacer layer 120 is alumina, then the spacer layer 120 may have a thickness of between three and fifty Angstroms.

The free layer 130 may be a synthetic free layer or, as shown, a simple free layer. The free layer 130 is configured to have an increased magnetic damping constant, the phenomenological Gilbert damping constant α, above. To increase the magnetic damping constant, the free layer 130 includes a dopant which raises the magnetic damping constant above what it would be in the absence of the dopant. In particular, the free layer 130 includes CoFeCuX, where X is preferably Tb, Gd, Pt, Ta, Os, Nb, Rh, or Ru. Also in a preferred embodiment, X is a few atomic percent. In the embodiment shown, the free layer 130 includes a CoFeCuX layer 134 as well as an optional insertion layer 132. The insertion layer 132 is ferromagnetic with high spin polarization and may include Co, Ni, Fe, or their alloys. If used, the thickness of the insertion layer 132 is between two and fifty Angstroms.

Figure 1B:
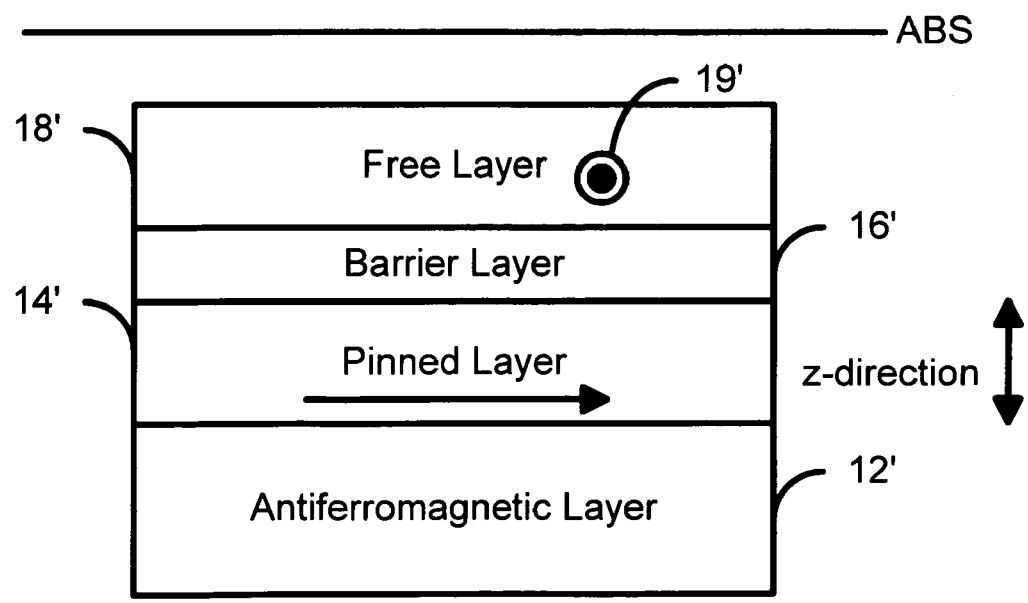
FIG. 1B is a diagram of another conventional magnetic element, a spin tunneling junction.

The magnetic element 100 functions in a similar manner to conventional magnetic elements, such as the conventional magnetic elements 10 and 10' depicted in FIGS. 1A and 1B, respectively. Referring back to FIG. 2A, the magnetic element 100 thus has a high resistance state (free layer 130 and pinned layer 110 magnetizations antiparallel) and a low resistance state (free layer 130 and pinned layer 110 magnetizations parallel). The magnetic element is also responsive to an external magnetic field, for example due to data in a recording media (not shown). In addition, the magnetic element 100 is preferably used in the CPP configuration.

The increase of the magnetic damping constant in the free layer 130 offsets part of the effect of the spin transfer torque. As a result, current-induced magnetic noise and current-induced asymmetric bias of the free layer are reduced.

Figure 2B:
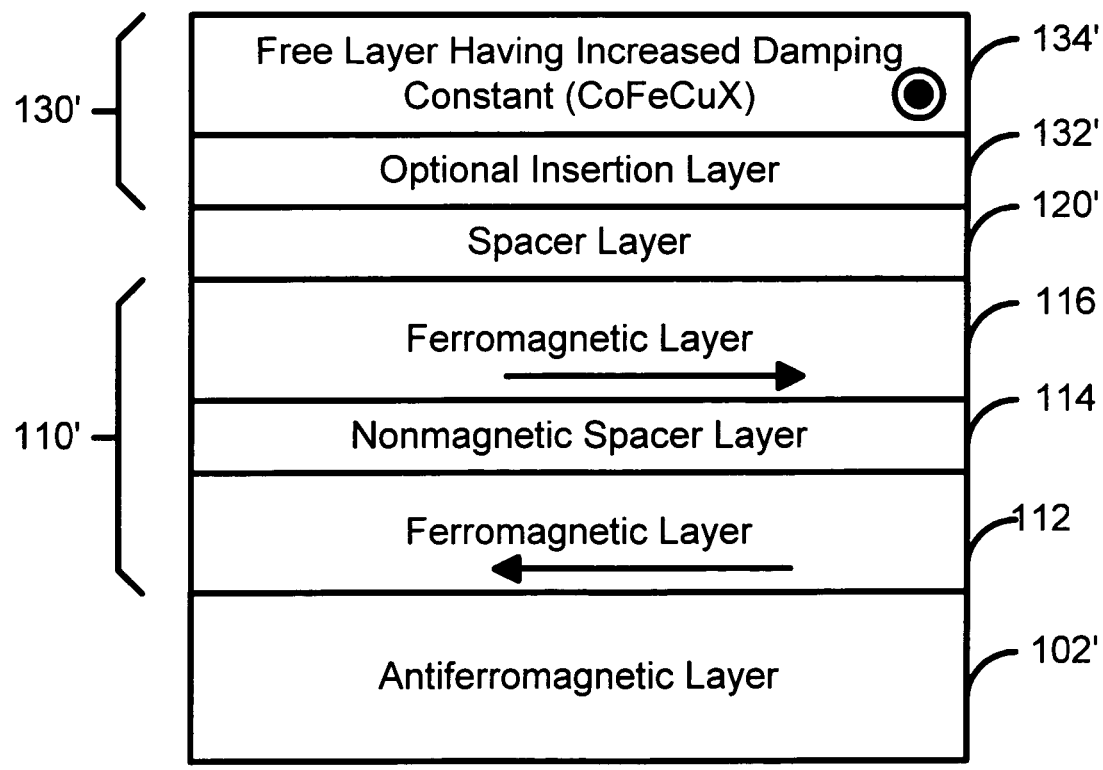
FIG. 2B depicts a second version of a first embodiment of a magnetic element in accordance with the present invention having reduced noise due to spin transfer.

FIG. 2B depicts a second version of a first embodiment 100' of a magnetic element in accordance with the present invention having reduced noise due to spin transfer. The magnetic element 100' is analogous to the magnetic element 100. Consequently, analogous components of the magnetic element 100' are labeled in a similar fashion to the magnetic element 100. Thus, the magnetic element 100' includes an AFM layer 102', a pinned layer 110', a spacer layer 120', and a free layer 130'. In a preferred embodiment, the AFM layer 102' is PtMn with a thickness between fifty and five hundred Angstroms. In addition, seed layers (not shown) and capping layers (not shown) may also be provided. The pinned layer 110' is ferromagnetic and, as shown, may be a synthetic pinned layer. The pinned layer 110' includes ferromagnetic layers 112 and 116 separated by a nonmagnetic spacer layer 114, which is preferably Ru. The nonmagnetic spacer layer 114 is configured such that the ferromagnetic layers 112 and 116 are antiferromagnetically coupled. The spacer layer 120' may be a conducting spacer layer, for example Cu, or an insulating tunneling barrier layer, such as alumina. If the spacer layer 120' is Cu, then the spacer layer 120' may have a thickness of between ten and one hundred Angstroms. If the spacer layer 120' is alumina, then the spacer layer 120' may have a thickness of between three and fifty Angstroms.

The free layer 130' may be synthetic or, as shown, a simple free layer. The free layer 130' is configured to have an increased magnetic damping constant. To do so, the free layer 130' includes a dopant which raises the magnetic damping constant above what it would be in the absence of the dopant. In particular, the free layer 130' includes CoFeCuX, where X is preferably Tb, Gd, Pt, Ta, Os, Nb, Rh, or Ru. Also in a preferred embodiment, X is a few atomic percent. In the embodiment shown, the free layer 130' includes a CoFeCuX layer 134 as well as an optional insertion layer 132. The insertion layer 132 is ferromagnetic and may include Co, Ni, Fe, or their alloys. If used, the thickness of the insertion layer 132 is between two and fifty Angstroms.

The magnetic element 100 functions in a similar manner to conventional magnetic elements, such as the conventional magnetic elements 10 and 10' depicted in FIGS. 1A and 1B, respectively. Referring back to FIG. 2B, the magnetic element 100' is responsive to an external magnetic field due to data in a recording media (not shown). In addition, current is driven through the magnetic element 100 in the CPP configuration.

Because of the configuration of the free layer 130', the magnetic element 100' shares the benefits of the magnetic element 100. In particular, the magnetic element 100' is subject to less noise induced by spin transfer. Furthermore, the synthetic antiferromagnetic structure of the pinned layer 110' helps in reducing the spin transfer torque exerted on the free layer 130, leading also to reduced spin transfer induced noise. When an electron current travels from pinned layer 110' to free layer 130', the corresponding spin current's polarization is decreased as electrons traverses the two ferromagnetic layers 112 and 116 of opposite magnetizations. The decrease in the spin current's polarization results in a decrease in the spin torque exerted onto the free layer 130'. In the reverse case, when an electron current travels from free layer 130' to the synthetic pinned layer 110', the majority of electrons reflected from the interface between layers 120' and 116 have their spins polarized opposite to those of the majority of electrons reflected from the interface between layers 114 and 112. These oppositely polarized reflected electrons partially cancel one another, resulting in a decrease in the spin torque exerted onto the free layer 130'.

Figure 2C:
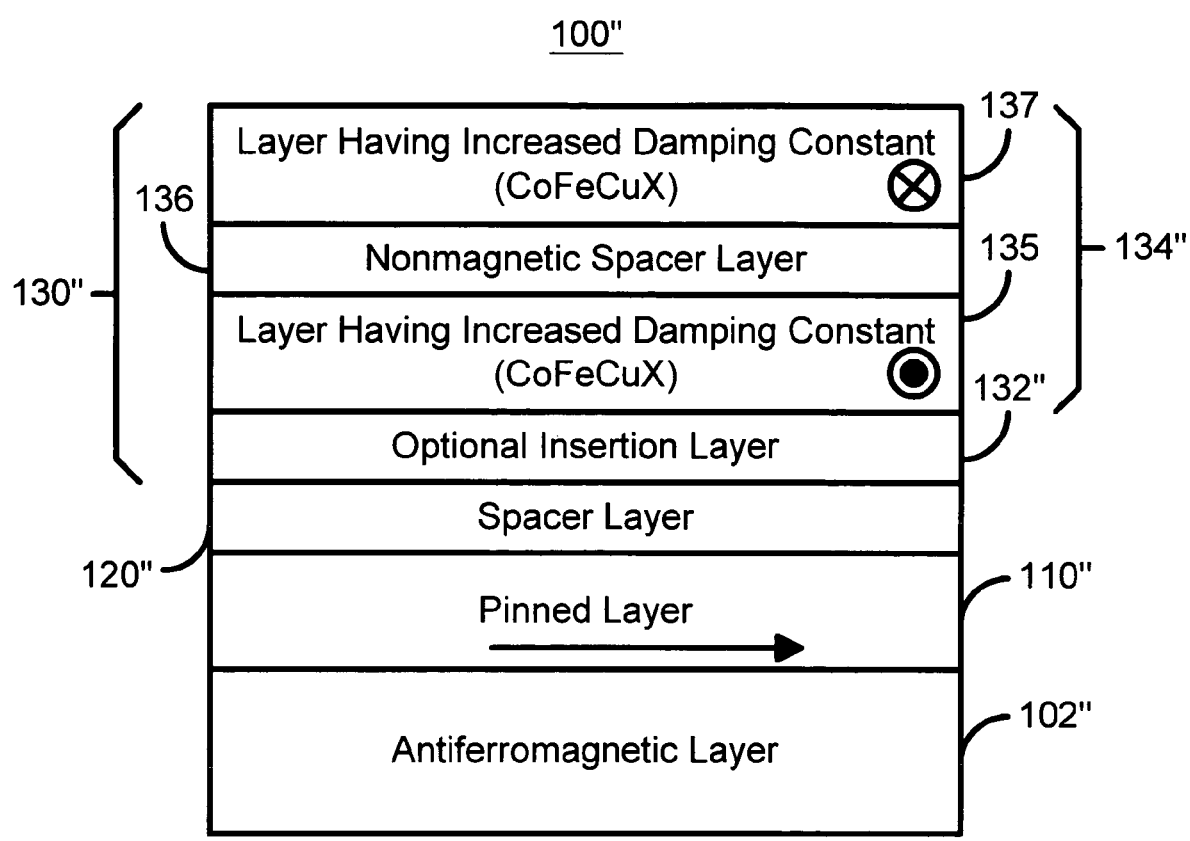
FIG. 2C depicts a third version of a first embodiment of a magnetic element in accordance with the present invention having reduced noise due to spin transfer.

FIG. 2C depicts a third version of a first embodiment of a magnetic element 100" in accordance with the present invention having reduced noise due to spin transfer. The magnetic element 100" is analogous to the magnetic elements 100 and 100'. Consequently, analogous components of the magnetic element 100" are labeled in a similar fashion to the magnetic element 100 and 100'. Thus, the magnetic element 100" includes an AFM layer 102", a pinned layer 110", a spacer layer 120", and a free layer 130". In a preferred embodiment, the AFM layer 102" is PtMn with a thickness between fifty and five hundred Angstroms. In addition, seed layers (not shown) and capping layers (not shown) may also be provided. The pinned layer 110" is ferromagnetic and may be a simple pinned layer, as shown, or a synthetic pinned layer as depicted in FIG. 2B. If simple, the pinned layer 110" may be Co90Fe10 with a thickness of between five and one hundred Angstroms. Referring back to FIG. 2C, the spacer layer 120" may be a conducting spacer layer, for example Cu, or an insulating tunneling barrier layer, such as alumina. If the spacer layer 120" is Cu, then the spacer layer 120" may have a thickness of between ten and one hundred Angstroms. If the spacer layer 120" is alumina, then the spacer layer 120" may have a thickness of between three and fifty Angstroms.

The free layer 130" may be synthetic, as shown. The free layer 130" is also configured to have an increased magnetic damping constant. To do so, the free layer 130" includes a dopant which raises the magnetic damping constant above what it would be in the absence of the dopant. In particular, the free layer 130" includes two ferromagnetic layers 135 and 137 separated by a nonmagnetic spacer layer 136, which is preferably Ru. The nonmagnetic spacer layer 136 is configured such that the ferromagnetic layers 135 and 137 are antiferromagnetically coupled. In order to reduce the magnetic damping constant of the free layer 130", one or (preferably) both of the ferromagnetic layers 135 and 137 includes CoFeCuX, where X is preferably Tb, Gd, Pt, Ta, Os, Nb, Rh, or Ru. Also in a preferred embodiment, X is a few atomic percent. In the embodiment shown, the free layer 130" includes a CoFeCuX synthetic layer 134" as well as an optional insertion layer 132". The insertion layer 132" is ferromagnetic and may include Co, Ni, Fe, or their alloys. If used, the thickness of the insertion layer 132" is between two and fifty Angstroms.

The magnetic element 100 functions in a similar manner to conventional magnetic elements, such as the conventional magnetic elements 10 and 10' depicted in FIGS. 1A and 1B, respectively. Referring back to FIG. 2B, the magnetic element 100" is responsive to an external magnetic field due to data in a recording media (not shown). In addition, current is driven through the magnetic element 100" in the CPP configuration.

Because of the configuration of the free layer 130", the magnetic element 100" shares the benefits of the magnetic elements 100 and 100'. In particular, the magnetic element 100" is subject to less noise induced by spin transfer.

Figure 3:
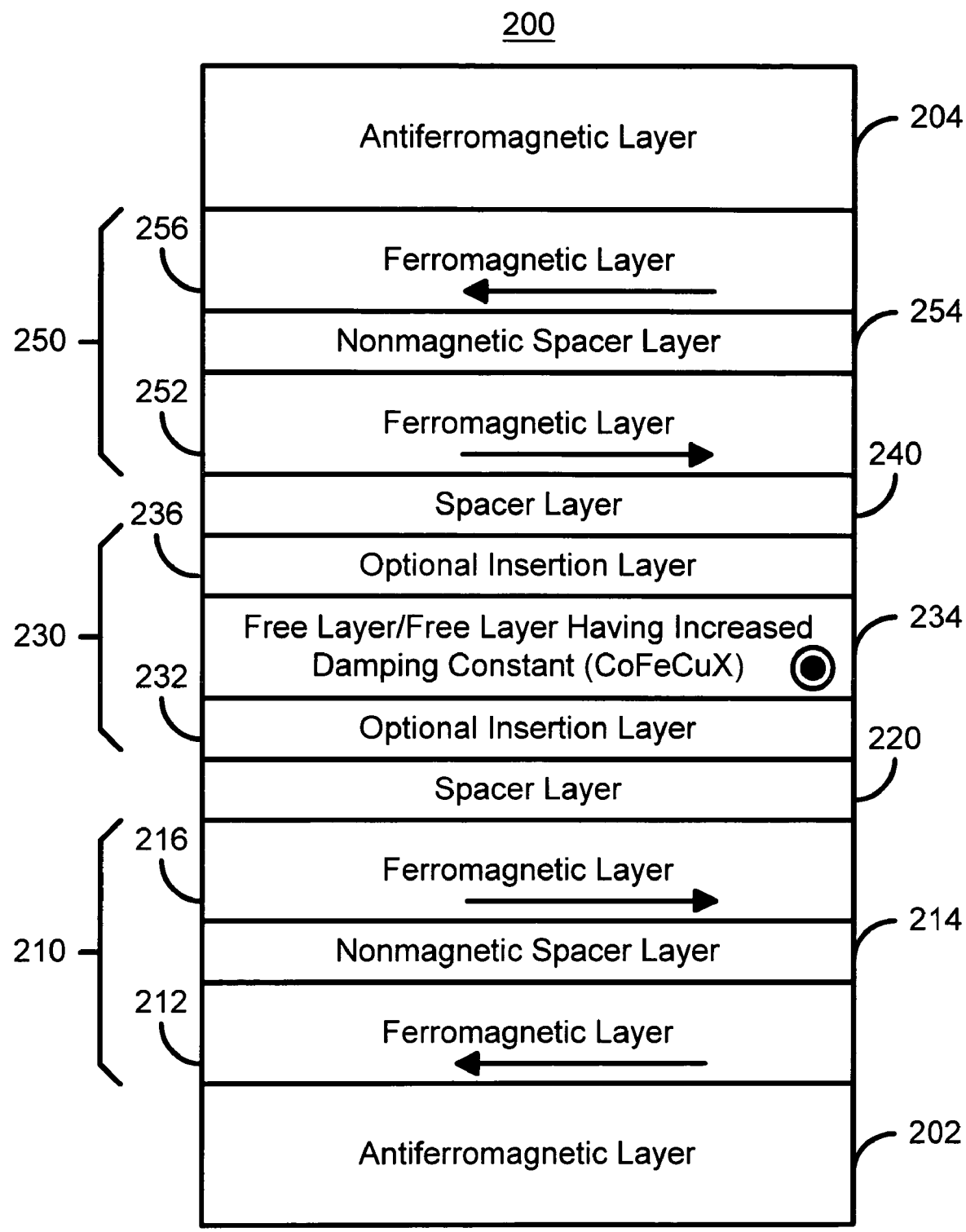
FIG. 3 depicts a second embodiment of a magnetic element in accordance with the present invention having reduced noise due to spin transfer.

FIG. 3 depicts a second embodiment of a magnetic element 200 in accordance with the present invention having reduced noise due to spin transfer. The magnetic element 200 is a dual spin valve or dual spin tunneling junction. Thus, portions of the magnetic element 200 are analogous to the magnetic elements 100, 100', and 100". The magnetic element 200 includes a first pinned layer 210, a first spacer layer 220, a free layer 230, a second spacer layer 240, and a second pinned layer 250. Also shown are pinning layers 202 and 204, which are generally AFM layers 202 and 204, respectively. In a preferred embodiment, the AFM layers 202 and 204 are PtMn with a thickness between fifty and five hundred Angstroms. In addition, seed layers (not shown) and capping layers (not shown) may also be provided. The spacer layers 220 and 240 may be a conducting spacer layer, for example Cu, or an insulating tunneling barrier layer, such as alumina. If the spacer layers 220 and/or 240 are Cu, the spacer layers 220 and/or 240 may have thicknesses of between ten and one hundred Angstroms. If the spacer layers 220 and/or 240 are alumina, then the spacer layers 220 and/or 240 may have a thickness of between three and fifty Angstroms. The pinned layers 210 and 250 may be simple, but are preferably synthetic as shown. If simple, the pinned layers 210 and 250 may be Co90Fe10 with a thickness of between five and one hundred Angstroms. In a preferred embodiment, the pinned layer 210 includes ferromagnetic layers 212 and 216 separated by a nonmagnetic spacer layer 214 that is preferably Ru. The nonmagnetic spacer layer 214 is configured so that the ferromagnetic layers 212 and 216 are antiferromagnetically coupled. Also in a preferred embodiment, the pinned layer 250 includes ferromagnetic layers 252 and 256 separated by a nonmagnetic spacer layer 254 that is preferably Ru. The nonmagnetic spacer layer 254 is configured so that the ferromagnetic layers 252 and 256 are antiferromagnetically coupled. Furthermore, the magnetizations of the ferromagnetic layers 212 and 256 are preferably oriented in the same direction. Such an orientation allows the AFM layers 202 and 204 to be annealed simultaneously in an external magnetic field.

The free layer 230 may be synthetic or, as shown, a simple free layer. The free layer 230 is configured to have an increased magnetic damping constant $\alpha$. To increase the magnetic damping constant, the free layer 230 includes a dopant which raises the magnetic damping constant above what it would be in the absence of the dopant. In particular, the free layer 230 preferably includes CoFeCuX, where X is preferably Tb, Gd, Pt, Ta, Os, Nb, Rh, or Ru. Also in a preferred embodiment, X is a few atomic percent. In the embodiment shown, the free layer 230 includes a CoFeCuX layer 234 as well as optional insertion layers 232 and 236. The insertion layers 232 and 236 are ferromagnetic and may include Co, Ni, Fe, or their alloys. If used, the thicknesses of the insertion layers 232 and 236 are between two and fifty Angstroms.

The magnetic element 200 functions in a similar manner to conventional magnetic elements, such as the conventional magnetic elements 10 and 10' depicted in FIGS. 1A and 1B, respectively. Referring back to FIG. 3, the magnetic element 200 is responsive to an external magnetic field due to data in a recording media (not shown). In addition, current is driven through the magnetic element 200 in the CPP configuration.

Because of the configuration of the free layer 230, the magnetic element 200 shares the benefits of the magnetic elements 100, 100', and 100'. In particular, the magnetic element 200 is subject to less noise induced by spin transfer. In addition, because the magnetic element 200 is a dual spin valve or a dual spin tunneling junction, the magnitude of the signal from the magnetic element 200 is enhanced.

Figure 4A:
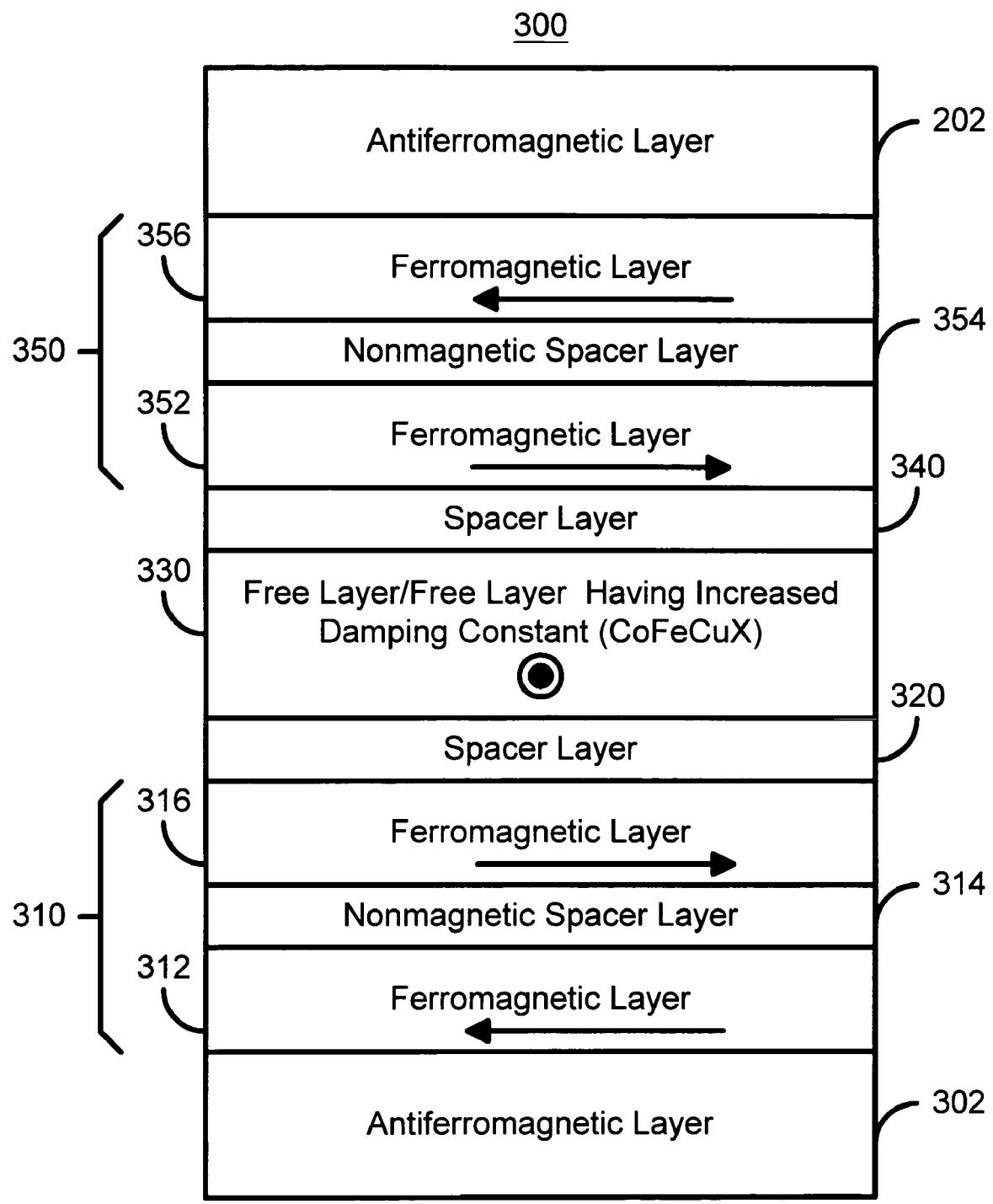
FIG. 4A depicts a first version of a third embodiment of a magnetic element in accordance with the present invention having reduced noise due to spin transfer.

FIG. 4A depicts a first version of a third embodiment of a magnetic element 300 in accordance with the present invention having reduced noise due to spin transfer. The magnetic element 300 is a dual spin valve or dual spin tunneling junction. Thus, portions of the magnetic element 300 are analogous to the magnetic elements 100, 100', 100", and 200. The magnetic element 300 includes a first pinned layer 310, a first spacer layer 320, a free layer 330, a second spacer layer 340, and a second pinned layer 350. Also shown are pinning layers 302 and 304, which are generally AFM layers 302 and 304, respectively. In a preferred embodiment, the AFM layers 302 and 304 are PtMn with a thickness between fifty and five hundred Angstroms. In addition, seed layers (not shown) and capping layers (not shown) may also be provided.

The magnetic element 300 functions in a similar manner to conventional magnetic elements, such as the conventional magnetic elements 10 and 10' depicted in FIGS. 1A and 1B, respectively. Referring back to FIG. 4A, the magnetic element 300 is responsive to an external magnetic field due to data in a recording media (not shown). In addition, current is driven through the magnetic element 300 in the CPP configuration.

The spacer layers 320 and 340 may be a conducting spacer layer, for example Cu, or an insulating tunneling barrier layer, such as alumina. If the spacer layers 320 and/or 340 are Cu, the spacer layers 320 and/or 340 may have thicknesses of between ten and one hundred Angstroms. If the spacer layers 320 and/or 340 are alumina, then the spacer layers 320 and/or 340 may have a thickness of between three and fifty Angstroms.

The free layer 330 may be synthetic or, as shown, a simple free layer. The free layer 330 may either be conventional or may be configured to have an increased magnetic damping constant ($\alpha$. In an embodiment in which the free layer 330 has an increased magnetic damping constant, the free layer 330 includes a dopant which raises the magnetic damping constant above what it would be in the absence of the dopant. In such an embodiment, the free layer 330 preferably includes CoFeCuX, where X is preferably Tb, Gd, Pt, Ta, Os, Nb, Rh, or Ru. Also in a preferred embodiment, X is a few atomic percent. The free layer 330 could also include a CoFeCuX layer (not explicitly shown) as well as an optional insertion layer (not explicitly shown). The insertion layer would be ferromagnetic and may include Co, Ni, Fe, or their alloys. If used, the thickness of the insertion layer is between two and fifty Angstroms.

The pinned layers 310 and 350 may be simple, but are preferably synthetic as shown. If simple, the pinned layers 310 and 350 may be Co90Fe10 with a thickness of between five and one hundred Angstroms. In a preferred embodiment, the pinned layer 310 includes ferromagnetic layers 312 and 316 separated by a nonmagnetic spacer layer 314 that is preferably Ru. The nonmagnetic spacer layer 314 is configured so that the ferromagnetic layers 312 and 316 are antiferromagnetically coupled. Also in a preferred embodiment, the pinned layer 350 includes ferromagnetic layers 352 and 356 separated by a nonmagnetic spacer layer 354 that is preferably Ru. The nonmagnetic spacer layer 354 is configured so that the ferromagnetic layers 352 and 356 are antiferromagnetically coupled. Furthermore, the magnetizations of the ferromagnetic layers 312 and 356 are preferably oriented in the same direction. Such an orientation allows the AFM layers 302 and 304 to be annealed simultaneously in an external magnetic field.

One or more of the pinned layers 310 and 350 are also configured to reduce the spin transfer effect. In particular, the pinned layers 310 and/or 350 are configured to reduce the net torque on the free layer 330 due to spin transfer. When current is driven in the CPP configuration, a forward torque and a reflected torque due to spin transfer may be exerted on the free layer 330. For example, when an electron current travels up the stack in FIG. 4A, a "forward" torque is exerted on the free layer 330 by the flowing electrons polarized by the pinned layer 310. (Note that because of the synthetic structure 310, this torque is smaller than what it would have been had the ferromagnetic layer 312 not been there.) In addition, another "reflected" torque is also exerted by the electrons reflected by the ferromagnetic layer 352 which travel back to the free layer 330. In the embodiment shown, in which the magnetizations of the ferromagnetic layers 316 and 352 are parallel, the net torque is the difference between the forward and reflected torques. This net torque can thus affect the magnetization of the free layer 330.

As discussed above, the pinned layers 310 and 350 are configured to reduce the spin transfer effect by reducing the net torque. In a preferred embodiment, the net torque is substantially zero. A zero net torque can be achieved by selecting the thicknesses and materials of the ferromagnetic layers 316 and/or 352 to achieve a lower spin polarization. For example, the ferromagnetic layer 316 may include twenty Angstroms of NiFe, while the ferromagnetic layer 352 may include CoFe/PtMn/CoFe/Ru/CoFe, CoFe/PtMn/Ru/CoFe, or CoFE/Ru/PtMn/CoFe. In such an embodiment, the forward torque from the ferromagnetic layer 316 and the reflected torque from the ferromagnetic layer 352 may nearly cancel. As a result, the spin transfer effect due to such forward and reflected electrons can be reduced to substantially zero.

Because of the configuration of the pinned layers 310 and/or 350 and the free layer 330, the magnetic element 300 shares the benefits of the magnetic elements 100, 200', and 300'. If the free layer 330 is configured to have an increased magnetic damping constant, then spin transfer induced noise is reduced. Configuring the pinned layers 310 and 350 to reduce the net torque also aids in mitigating the spin transfer induced noise. In addition, because the magnetic element 200 is a dual spin valve or a dual spin tunneling junction, the magnitude of the signal from the magnetic element 200 is enhanced.

Figure 4B:
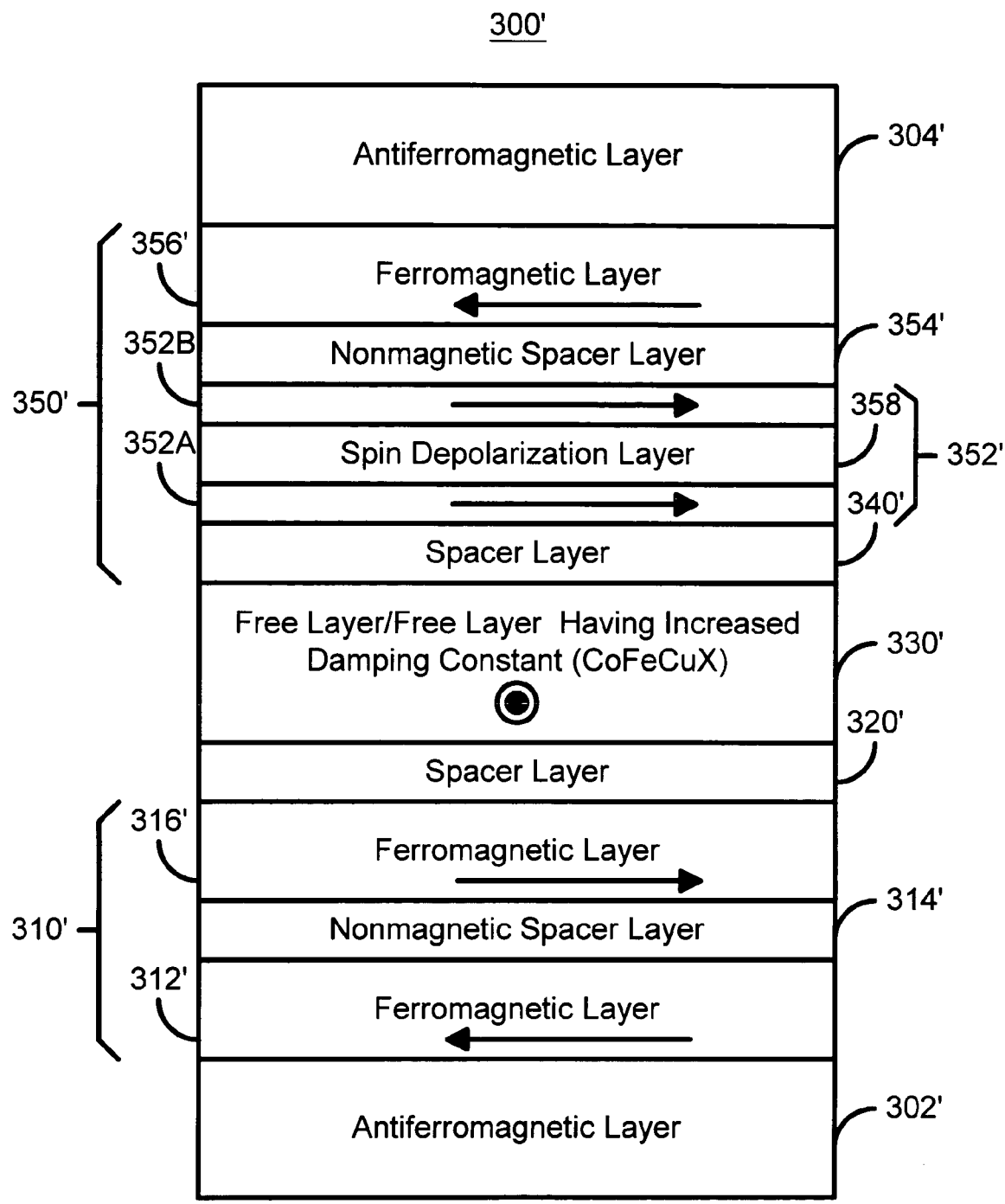
FIG. 4B depicts a second version of a third embodiment of a magnetic element in accordance with the present invention having reduced noise due to spin transfer.

FIG. 4B depicts a second version of a third embodiment of a magnetic element 300' in accordance with the present invention having reduced noise due to spin transfer. The magnetic element 300' is analogous to the magnetic element 300. Consequently, analogous components of the magnetic element 300" are labeled in a similar fashion to the magnetic element 100. The magnetic element 300" includes a first pinned layer 310", a first spacer layer 320", a free layer 330", a second spacer layer 340", and a second pinned layer 350". In a preferred embodiment, the AFM layers 302" and 304" are PtMn with a thickness between fifty and five hundred Angstroms. In addition, seed layers (not shown) and capping layers (not shown) may also be provided. The spacer layers 320" and 340" may be a conducting spacer layer, for example Cu, or an insulating tunneling barrier layer, such as alumina. If the spacer layers 320" and/or 340" are Cu, the spacer layers 320" and/or 340" may have thicknesses of between ten and one hundred Angstroms. If the spacer layers 320" and/or 340" are alumina, then the spacer layers 320" and/or 340" may have a thickness of between three and fifty Angstroms.

The free layer 330" may be synthetic or a simple free layer. The free layer 330' may either be conventional or may be configured to have an increased magnetic damping constant $\alpha$. In an embodiment in which the free layer 330' has an increased magnetic damping constant, the free layer 330' includes a dopant which raises the magnetic damping constant above what it would be in the absence of the dopant. In particular, in such an embodiment, the free layer 330' preferably includes CoFeCuX, where X is preferably Tb, Gd, Pt, Ta, Os, Nb, Rh, or Ru. Also in a preferred embodiment, X is a few atomic percent. The free layer 330' could include a CoFeCuX layer (not explicitly shown) as well as an optional insertion layer (not explicitly shown). The insertion layer would be ferromagnetic and may include Co, Ni, Fe, or their alloys. If used, the thickness of the insertion layer is between two and fifty Angstroms.

The pinned layers 310' and 350' are preferably synthetic as shown. In a preferred embodiment, the pinned layer 310' includes ferromagnetic layers 312' and 316' separated by a nonmagnetic spacer layer 314' that is preferably Ru. The nonmagnetic spacer layer 314' is configured so that the ferromagnetic layers 312 and 316' are antiferromagnetically coupled. Also in a preferred embodiment, the pinned layer 350' includes ferromagnetic layers 352' and 356' separated by a nonmagnetic spacer layer 354' that is preferably Ru. The nonmagnetic spacer layer 354' is configured so that the ferromagnetic layers 352' and 356' are antiferromagnetically coupled. Furthermore, the magnetizations of the ferromagnetic layers 312' and 356' are preferably oriented in the same direction. Such an orientation allows the AFM layers 302' and 304' to be annealed simultaneously in an external magnetic field.

One or more of the pinned layers 310' and 350' are also configured to reduce the spin transfer effect. In particular, the pinned layer 310' and/or 350' are configured to reduce the net torque on the free layer 330' due to spin transfer. In a preferred embodiment, the net torque is substantially zero. A zero net torque can be achieved by selecting the thicknesses and materials of the ferromagnetic layers 316' and/or 356' to achieve a lower spin polarization, as described above. For example, the ferromagnetic layer 316' may include twenty Angstroms of NiFe, while the ferromagnetic layer 352 may include CoFe/PtMn/CoFe/Ru/CoFe, CoFe/PtMn/Ru/CoFe, or CoFe/Ru/PtMn/CoFe. In such an embodiment, the forward torque from the ferromagnetic layer 316' and the reflected torque from the ferromagnetic layer 352' may nearly cancel.

In addition, one or more of the pinned layers 310' and 350' (the pinned layer 350' in the embodiment shown in FIG. 4B) includes a spin depolarization layer (SPDL) 358. The SPDL 358 is configured to depolarize at least a portion of a plurality of electrons passing through it. Stated differently, the SPDL 358 is configured to randomize the spins of charge carriers (i.e. electrons) traveling through the SPDL 358. Consequently, the thickness, t, of the SPDL 358 should not be too much smaller than its spin diffusion length. On the other hand, the thickness t should small enough so that the direct coupling between the ferromagnetic layers 352A and 352B is not substantially adversely affected. For example, while the spin diffusion length for PtMn is around twenty Angstroms, an SPDL 358 consisting of PtMn is preferably about eight Angstrom thick. In a preferred embodiment, the SPDL 358 includes PtMn, IrMn, CuMn, and/or CuPt. If CuMn is used, the portion of the SPDL 358 including CuMn is preferably two to eight atomic percent Mn. If CuPt is used, the portion of the SPDL 358 including CuPt is preferably two to eight atomic percent Pt. Also in a preferred embodiment, the SPDL 358 is between two and eight Angstroms thick. For a thickness of two through eight Angstroms and the materials listed above, the SPDL 358 can be deposited such that it is discontinuous. For the above materials, such a thickness is sufficient for the SPDL 358 to be thick enough to effectively depolarize the electrons passing through and thin enough so that the ferromagnetic layers 352A and 352B remain strongly ferromagnetically coupled.

Because of the use of the SPDL 358, only electrons reflecting from the ferromagnetic layer 352A contribute to the reflected torque for spin transfer. Consequently, it may be easier to tailor the ferromagnetic layers 316' and 352' to reduce the net torque to zero.

Because of the configuration, of the pinned layers 310' and/or 350', the SPDL 358, and the free layer 330', the magnetic element 300' shares the benefits of the magnetic elements 100, 200', and 300'. If the free layer 330' is configured to have an increased magnetic damping constant, then spin transfer induced noise is further reduced. Configuring the pinned layers 310' and 320' to reduce the net torque with the use of the SPDL 358 also aids in mitigating the spin transfer induced noise. In addition, because the magnetic element 300' is a dual spin valve or a dual spin tunneling junction, the magnitude of the signal from the magnetic element 300' is enhanced.

Figure 4C:
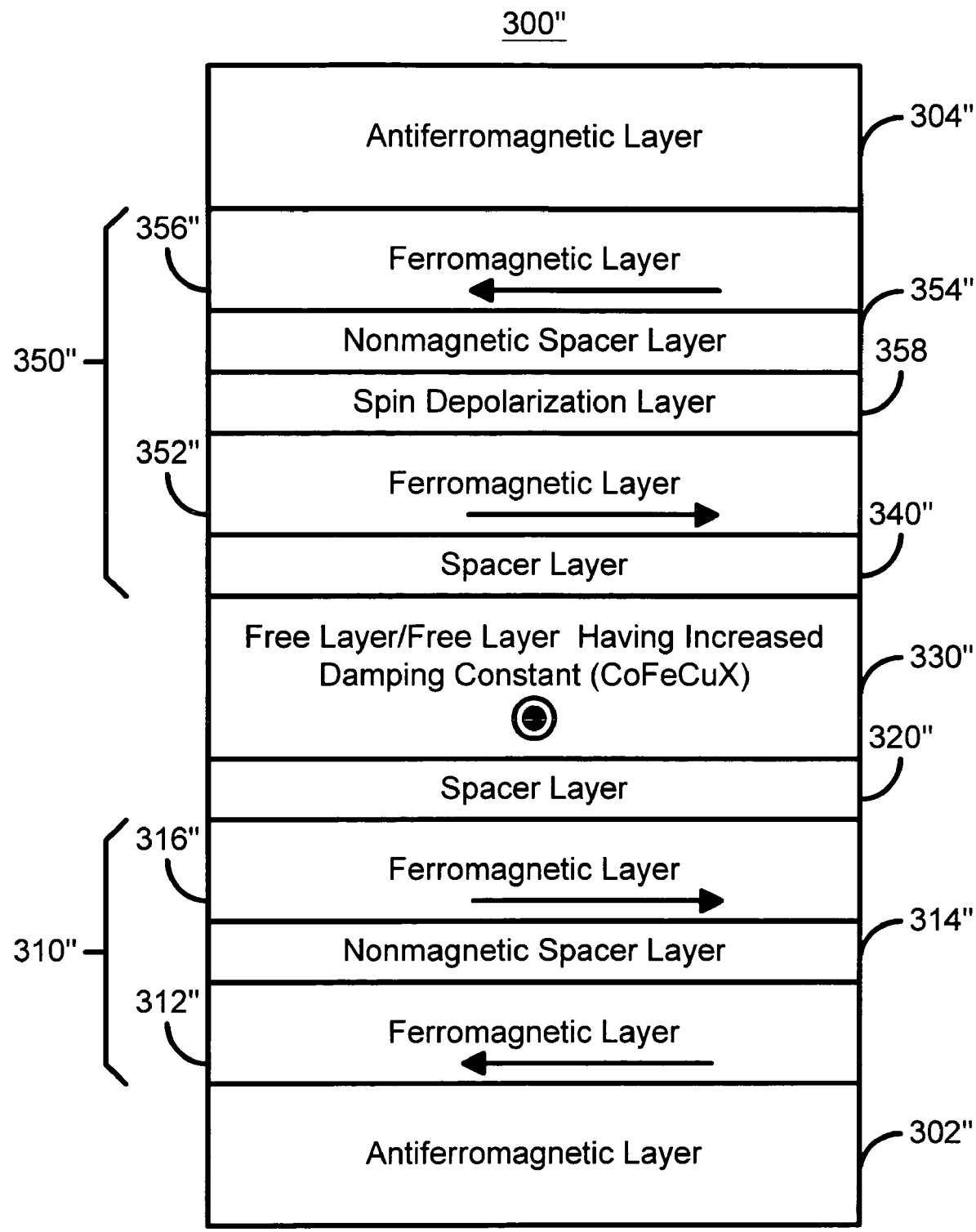
FIG. 4C depicts a third version of a third embodiment of a magnetic element in accordance with the present invention having reduced noise due to spin transfer.

FIG. 4C depicts a third version of a third embodiment of a magnetic element 300" in accordance with the present invention having reduced noise due to spin transfer. The magnetic element 300" is analogous to the magnetic elements 300 and 300'. Consequently, analogous components of the magnetic element 300" are labeled in a similar fashion to the magnetic element 300 and 300'. The magnetic element 300" includes a first pinned layer 310", a first spacer layer 320", a free layer 330", a second spacer layer 340", and a second pinned layer 350". In a preferred embodiment, the AFM layers 302" and 304" are PtMn with a thickness between fifty and five hundred Angstroms. In addition, seed layers (not shown) and capping layers (not shown) may also be provided. The spacer layers 320" and 340" may be a conducting spacer layer, for example Cu, or an insulating tunneling barrier layer, such as alumina. If the spacer layers 320" and/or 340" are Cu, the spacer layers 320" and/or 340" may have thicknesses of between ten and one hundred Angstroms. If the spacer layers 320" and/or 340" are alumina, then the spacer layers 320" and/or 340" may have a thickness of between three and fifty Angstroms.

The free layer 330" may be synthetic or, as shown, a simple free layer. The free layer 330" may either be conventional or may be configured to have an increased magnetic damping constant $\alpha$. In an embodiment in which the free layer 330' has an increased magnetic damping constant, the free layer 330" includes a dopant which raises the magnetic damping constant above what it would be in the absence of the dopant. In particular, in such an embodiment, the free layer 330" preferably includes CoFeCuX, where X is preferably Th, Gd, Pt, Ta, Os, Nb, Rh, or Ru. Also in a preferred embodiment, X is a few atomic percent. The free layer 330" could include a CoFeCuX layer (not explicitly shown) as well as an optional insertion layer with high spin polarization (not explicitly shown). The insertion layer would be ferromagnetic and may include Co, Ni, Fe, or their alloys. If used, the thickness of the insertion layer is between two and fifty Angstroms.

The pinned layers 310" and 350" are preferably synthetic as shown. In a preferred embodiment, the pinned layer 310" includes ferromagnetic layers 312" and 316" separated by a nonmagnetic spacer layer 314" that is preferably Ru. The nonmagnetic spacer layer 314" is configured so that the ferromagnetic layers 312" and 316" are antiferromagnetically coupled. Also in a preferred embodiment, the pinned layer 350", includes ferromagnetic layers 352' and 356" separated by a nonmagnetic spacer layer 354" that is preferably Ru. The nonmagnetic spacer layer 354" is configured so that the ferromagnetic layers 352" and 356" are antiferromagnetically coupled. Furthermore, the magnetizations of the ferromagnetic layers 312" and 356" are preferably oriented in the same direction. Such an orientation allows the AFM layers 302" and 304" to be annealed simultaneously in an external magnetic field.

One or more of the pinned layers 310" and 350" are also configured to reduce the spin transfer effect. In particular, the pinned layer 310" and/or 350" are configured to reduce the net torque on the free layer 330" due to spin transfer. In a preferred embodiment, the net torque is substantially zero. A zero net torque can be achieved by selecting the thicknesses and materials of the ferromagnetic layers 316" and/or 356" to achieve a lower spin polarization, as described above. For example, the ferromagnetic layer 316' may include twenty Angstroms of NiFe, while the ferromagnetic layer 352 may include CoFe/PtMn/CoFe/Ru/CoFe, CoFe/PtMn/Ru/CoFe, or CoFE/Ru/PtMn/CoFe. In such an embodiment, the forward torque from the ferromagnetic layer 316" and the reflected torque from the ferromagnetic layer 352" may nearly cancel.

In addition, one or more of the pinned layers 310" and 350" (the pinned layer 350" in the embodiment shown in FIG. 4B) includes a spin depolarization layer (SPDL) 358'. The SPDL 358' is analogous to the SPDL 358 depicted in FIG. 4B. Referring back to FIG. 4C, the SPDL 358' is thus configured to depolarize at least a portion of a plurality of electrons passing through it. However, the ferromagnetic layers 352" and 356" are still strongly antiferromagnetically coupled. In a preferred embodiment, the SPDL 358' includes PtMn, IrMn, CuMn, and/or CuPt. If CuMn is used, the portion of the SPDL 358' including CuMn is preferably two to eight atomic percent Mn. If CuPt is used, the portion of the SPDL 358' including CuPt is preferably two to eight atomic percent Pt. Also in a preferred embodiment, the SPDL 358 is between two and eight Angstroms thick. For a thickness of two through eight Angstroms and the materials listed above, the SPDL 358' can be deposited such that it is discontinuous. For the above materials, such a thickness is sufficient for the SPDL 358' to be thick enough to effectively depolarize the electrons passing through and thin enough so that the ferromagnetic layers 352A" and 352B" remain strongly ferromagnetically coupled.

Because of the use of the SPDL 358', only electrons reflecting from the ferromagnetic layer 352A' contribute to the reflected torque for spin transfer. Consequently, it may be easier to tailor the ferromagnetic layers 316" and 352" to reduce the net torque to close to zero.

Because of the configuration of the pinned layers 310", and/or 350", the SPDL 358', and the free layer 330", the magnetic element 300" shares the benefits of the magnetic elements 100, 200', and 300'. If the free layer 330' is configured to have an increased magnetic damping constant, then spin transfer induced noise is further reduced. Configuring the pinned layers 310' and 320' to reduce the net torque and the use of the SPDL 358 also aids in mitigating the spin transfer induced noise. In addition, because the magnetic element 200" is a dual spin valve or a dual spin tunneling junction, the magnitude of the signal from the magnetic element 200" is enhanced.

Figure 5:
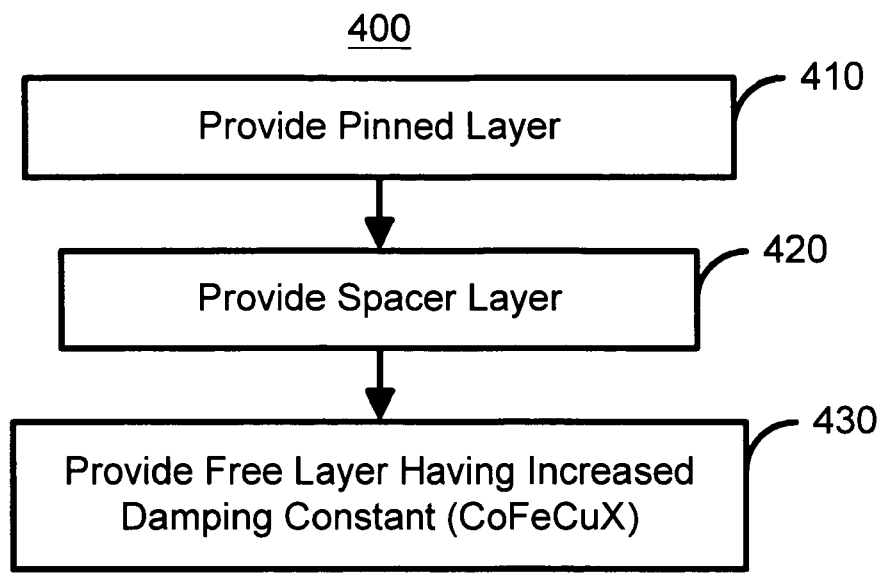
FIG. 5 depicts one embodiment of a method for providing the first embodiment of a magnetic element in accordance with the present invention having reduced noise due to spin transfer.

FIG. 5 depicts one embodiment of a method 400 for providing the first embodiment of a magnetic element in accordance with the present invention having reduced noise due to spin transfer. The method 400 is described in the context of the magnetic element 100. However, nothing prevents the use of the method 400 with another type of magnetic elements.

The pinned layer 110 is provided, via step 410. The pinned layer provided in step 110 is ferromagnetic, has a pinned layer magnetization, and may be synthetic or simple. A spacer layer 120 that is nonmagnetic is provided, via step 420. A free layer 130 that is configured to have an increased magnetic damping constant is provided on the spacer layer 120, via step 430. The spacer layer thus resides between the pinned layer and the free layer. The free layer 130 includes CoFeCuX where X is Tb, Gd, Pt, Ta, Os, Nb, Rh, or Ru.

Using the method 400, magnetic elements 100, 100', and 100''' may be provided. Consequently, magnetic elements having reduced noise due to the spin transfer effect can be fabricated.

Figure 6:
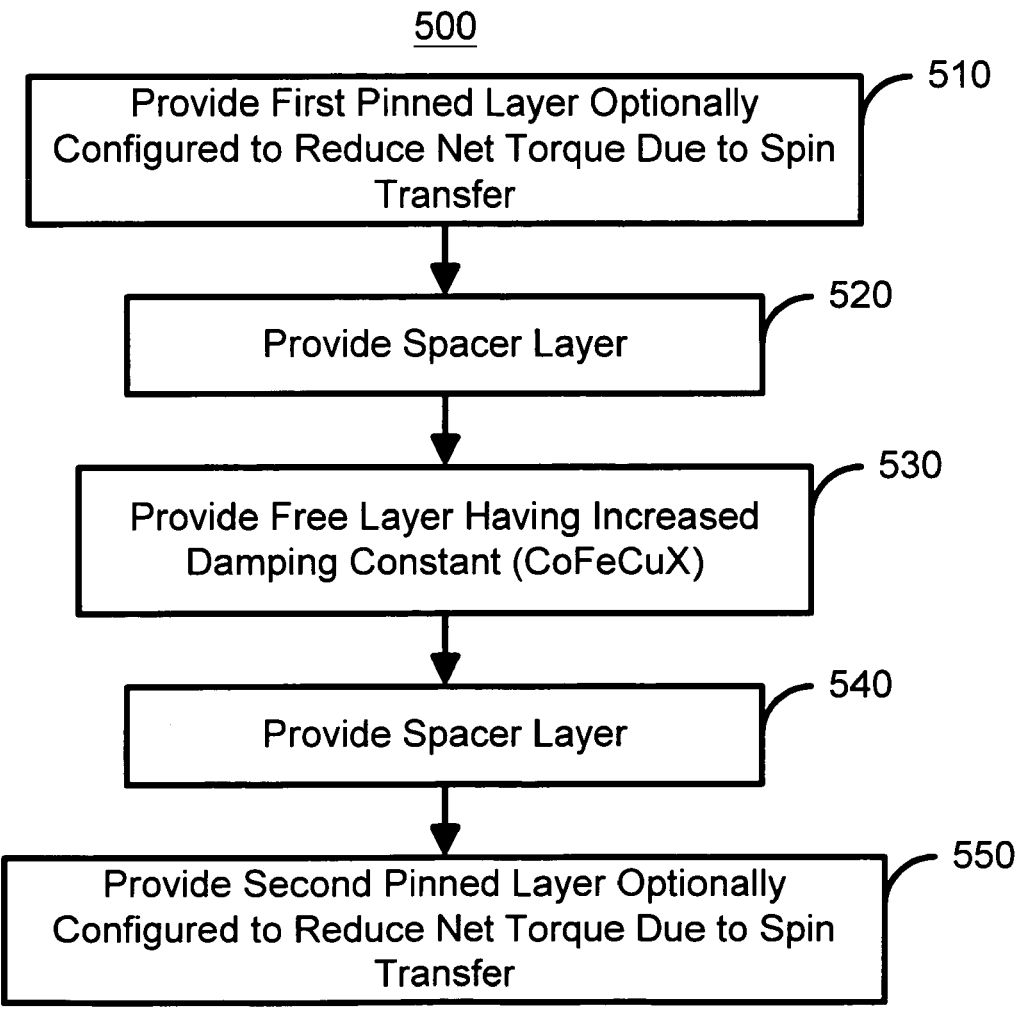
FIG. 6 depicts one embodiment of a method for providing the second or third embodiment of a magnetic element in accordance with the present invention having reduced noise due to spin transfer.

FIG. 6 depicts one embodiment of a method 500 for providing the second or third embodiment of a magnetic element in accordance with the present invention having reduced noise due to spin transfer. The method 500 is described in the context of the magnetic element 300'. However, nothing prevents the use of the method 500 with another type of magnetic elements.

A first, preferably synthetic, pinned layer 310' is provided, via step 510. The synthetic pinned layer 310' provided in step 510 may be configured to reduce the spin transfer induced noise. For example, the appropriate materials and thicknesses may be used in step 510. In addition, an SPDL, analogous to the SPDL 358, may be provided in step 510. A first spacer layer 320' that is nonmagnetic is provided, via step 520. A free layer 330' is provided, via step 530. Step 530 may include providing a free layer 330' that is synthetic or simple. In addition, step 530 may also be used to provide a general free layer or a free layer having an increased magnetic damping constant. A second spacer layer 340' that is nonmagnetic is provided, via step 540. A second, preferably synthetic, pinned layer 350' is provided, via step 550. The synthetic pinned layer 350' provided in step 550 may be configured to reduce the spin transfer induced noise. For example, the appropriate materials and thicknesses may be used in step 550. In addition, an SPDL, analogous to the SPDL 358, may be provided in step 550.

Using the method 400, magnetic elements 200, 300, 300', and 300" may be provided. Consequently, magnetic elements having reduced noise due to the spin transfer effect can be fabricated.

A method and system has been disclosed for providing an improved magnetic element that has reduced noise due to using spin transfer. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic element comprising:
   a pinned layer being ferromagnetic and having a pinned layer magnetization;
   a spacer layer, the spacer layer being non magnetic; and
   a free layer, the spacer layer residing between the pinned layer and the free layer, the free layer being ferromagnetic and having a free layer magnetization, the free layer being configured to have an increased magnetic damping constant;
   wherein the free layer includes CoFeCuX where X is Tb, Gd, Pt, Ta, Os, Nb, Rh, or Ru.

2. The magnetic element of claim 1 wherein X is less than or equal to five atomic percent of Tb, Gd, Pt, Ta, Os, Nb, Rh, or Ru.

3. The magnetic element of claim 1 wherein the free layer further includes an insertion layer including at least one ferromagnetic material.

4. The magnetic element of claim 1 wherein the free layer is a synthetic free layer.

5. The magnetic element of claim 1 wherein the pinned layer is a synthetic pinned layer.

6. The magnetic element of claim 1 further comprising a second spacer layer and a second pinned layer, the second spacer layer residing between the second pinned layer and the free layer.

7. The magnetic element of claim 6 wherein the free layer further includes a first insertion layer including at least one ferromagnetic material, the first insertion layer residing between the free layer and the pinned layer or the second pinned layer.

8. The magnetic element of claim 7 wherein the at least one ferromagnetic material includes Go, Ni, Fe, and/or alloys of Go, Ni, Fe.

9. The magnetic element of claim 7 wherein the free layer further includes at least a second insertion layer, the second insertion layer residing between the free layer and an other of the pinned layer and the second pinned layer.

10. The magnetic element of claim 6 wherein the pinned layer is a first synthetic pinned layer including a first ferromagnetic layer having a first magnetization, a second ferromagnetic layer having a second magnetization, and a first nonmagnetic spacer layer between the first ferromagnetic layer and the second ferromagnetic layer, the first nonmagnetic spacer layer being configured so that the first magnetization and the second magnetization are antiferromagnetically aligned; and
   wherein the second pinned layer is a second synthetic pinned layer including a third ferromagnetic layer having a third magnetization, a fourth ferromagnetic layer having a fourth magnetization, and a second non magnetic spacer layer between the third ferromagnetic layer and the fourth ferromagnetic layer, the second nonmagnetic spacer layer being configured so that the third magnetization and the fourth magnetization are antiferromagnetically aligned.

11. The magnetic element of claim 10 wherein the second ferromagnetic layer is closer to the free layer than the first ferromagnetic layer, wherein the third ferromagnetic layer is closer to the free layer than the fourth ferromagnetic layer, and wherein the second ferromagnetic layer and/or the third ferromagnetic layer are configured such that a forward torque and a reflected torque due to a current driven through the magnetic element in a current-perpendicular-to-plane (CPP) configuration are substantially equal and opposite.

12. The magnetic element of claim 11 wherein the third pinned layer further includes a spin depolarization layer, the spin depolarization layer being configured to depolarize at least a portion of a plurality of electrons passing through the spin depolarization layer.

13. A method or providing a magnetic element comprising:
  providing a pinned layer being ferromagnetic and having a pinned layer magnetization;
  providing a spacer layer, the spacer layer being nonmagnetic; and
  providing a free layer, the spacer layer residing between the pinned layer and the free layer, the free layer being ferromagnetic and having a free layer magnetization, the free layer being configured to have an increased magnetic damping constant;
  wherein the free layer providing step further includes
  providing at least one layer of CoFeCuX where X is Tb, Gd, Pt, Ta, Os, Nb, Rh, or Ru.

* * * * *